(12) United States Patent
Takahashi et al.

(10) Patent No.: US 8,102,049 B2
(45) Date of Patent: Jan. 24, 2012

(54) SEMICONDUCTOR DEVICE INCLUDING THROUGH ELECTRODE AND METHOD OF MANUFACTURING THE SAME

(75) Inventors: Nobuaki Takahashi, Kanagawa (JP); Masahiro Komuro, Kanagawa (JP); Koji Soejima, Kanagawa (JP); Satoshi Matsui, Kanagawa (JP); Masaya Kawano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 198 days.

(21) Appl. No.: 11/842,973

(22) Filed: Aug. 22, 2007

(65) Prior Publication Data
US 2008/0048337 A1 Feb. 28, 2008

(30) Foreign Application Priority Data

Aug. 25, 2006 (JP) ................. 2006-229923

(51) Int. Cl.
*H01L 23/52* (2006.01)
(52) U.S. Cl. ............... 257/741; 257/762; 257/767
(58) Field of Classification Search .................. None
See application file for complete search history.

(56) References Cited

U.S. PATENT DOCUMENTS

| 6,399,479 B1 * | 6/2002 | Chen et al. ............ 438/628 |
| 6,831,367 B2 | 12/2004 | Sekine | |
| 7,425,507 B2 * | 9/2008 | Lake ............... 438/694 |
| 7,589,021 B2 * | 9/2009 | Hong ............... 438/687 |
| 2005/0233581 A1 | 10/2005 | Soejima et al. | |
| 2009/0145744 A1 | 6/2009 | Yoshii et al. | |

FOREIGN PATENT DOCUMENTS

| JP | 63-127550 | 5/1988 |
| JP | 3-46353 | 2/1991 |
| JP | 3-153057 | 7/1991 |
| JP | 2003-203914 | 7/2003 |
| JP | 2004-128063 | 4/2004 |
| JP | 2005-183548 | 7/2005 |
| JP | 2005-294582 | 10/2005 |
| JP | 2006-32984 | 2/2006 |
| JP | 2006-183145 | 7/2006 |

OTHER PUBLICATIONS

Japanese Official Action—2006-229923—Jun. 20, 2011.
Japanese Official Action—2006-229923—Apr. 5, 2011.

\* cited by examiner

*Primary Examiner* — Benjamin Sandvik
*Assistant Examiner* — Krista Soderholm
(74) *Attorney, Agent, or Firm* — Young & Thompson

(57) ABSTRACT

The present invention provides a semiconductor device including at least one of an insulating layer and a semiconductor layer each including a hole formed therein, and a through electrode provided in the hole. In the semiconductor device, the side wall of the hole is constituted of a first region from the opening of the hole to a predetermined position between the opening of the hole and the bottom surface of the hole, and a second region from the predetermined position to the bottom surface of the hole. The through electrode includes a seed layer and a plating layer. The seed layer covers the second region and the bottom surface of the hole without covering the first region. In addition, the plating layer covers the seed layer and at least a part of the first region.

14 Claims, 11 Drawing Sheets

United States Patent US 8,102,049 B2

SEMICONDUCTOR DEVICE INCLUDING THROUGH ELECTRODE AND METHOD OF MANUFACTURING THE SAME

BACKGROUND OF THE INVENTION

1. Field of the Invention

The present invention relates to a semiconductor device including a through electrode and a method of manufacturing the same.

2. Description of Related Art

In recent years, in order to achieve larger-scale integration of semiconductor devices, a three-dimensional mounting technique to stack semiconductor devices has been utilized. In order to adapt to such technique, it has been attempted to provide a through electrode in a semiconductor substrate.

As a method of forming a through electrode, proposed is a method described in Japanese Laid-Open Patent Publication No. Sho 63-127550, for example.

In this method, as shown in FIG. 1A, a source electrode 801 and an oxide film 802 are formed on the front surface (the lower surface in FIG. 10A) of a GaAs substrate 800, and meanwhile, a photoresist film 803 is formed on the rear surface (the upper surface in FIG. 10A) of the GaAs substrate 800.

Next, a through hole extending to the source electrode 801 is formed by use of the photoresist film 803 serving as a mask.

Thereafter, as shown in FIG. 10B, an Au film 805 is formed on the source electrode 801 and the photoresist film 803 with the photoresist mask 803 remaining unremoved.

Furthermore, as shown in FIG. 10C, the Au film 805 is selectively removed, and the photoresist film 803 is removed as well.

Next, as shown in FIG. 1D, Au plating grows only in the through hole by use of an electroless Au plating bath. The through hole is thus filled with an Au layer 806. In this case, it takes approximately three hours for the Au plating to grow enough.

In addition, as another example of forming a through electrode, also proposed is a method described in Japanese Patent Application Laid-open Publication No. 2005-294582.

In this method, as shown in FIG. 11A, an electro deposited insulating film 902 is formed on an opening portion (hole) 901 formed on a silicon substrate 900. Moreover, a seed layer is formed on the electrodeposited insulating film 902.

Next, a portion of the seed layer other than a portion on the area of the hole 901 is removed. Here, as described in paragraph 0084 of Japanese Patent Application Laid-open Publication No. 2005-294582, the seed layer is formed on the entire surface of the inner wall of the hole 901.

Thereafter, as shown in FIG. 11B, electrolytic plating of Ni is performed. Then, Au plating film 903 is provided on the surface of the seed layer. A large diameter plug 904 is thus obtained.

In the method described in Japanese Laid-Open Patent Publication No. Sho 63-127550, however, there is a problem that it requires some time to form a through electrode since the Au film 805 is formed only on the bottom surface of the through hole, and then the Au plating grows from the bottom to the top of the through hole to form the through electrode.

On the other hand, in the method described in Japanese Laid-Open Patent Publication No. 2005-294582, since a seed layer is formed on the entire surface of the inner wall of the hole 901, the plating around the opening of the hole 901 grows faster than the plating inside the hole 901 does when electroless plating is performed. This is because the plating solution is frequently changed around the opening of the hole 901.

For this reason, there is a problem that the opening of the hole 901 is buried with the plating layer, thereby generating a void inside the hole 901.

SUMMARY OF THE INVENTION

The present invention provides a semiconductor device including: at least one of an insulating layer and a semiconductor layer each including a hole formed therein; and a through electrode provided in the hole of at least one of the layers. In the semiconductor device, the side wall of the hole is constituted of: a first region from the opening of the hole to a predetermined position between the opening of the hole and the bottom surface of the hole; and a second region from the predetermined position to the bottom surface of the hole. In addition, the through electrode in the semiconductor device includes: a seed layer that covers the second region and the bottom surface of the hole without covering the first region; and a plating layer. Moreover, the plating layer in the semiconductor device covers the seed layer and at least a part of the first region.

Here, the semiconductor device according to the present invention may be a semiconductor chip in which a semiconductor element is implemented. In addition, the semiconductor device according to the present invention may be a semiconductor chip in which a semiconductor element is not implemented (for example, a silicon spacer disposed between a pair of semiconductor chips).

Moreover, the seed layer may cover the entire surface of the second region, or may cover only a part of the second region.

Furthermore, the plating layer may be one that covers the entire surface of the first region, as long as covering at least a part of the first region.

According to the invention, in the side wall of the hole, a region from the opening of the hole to a predetermined region between the opening of the hole and the bottom surface of the hole is defined as the first region not covered with the seed layer.

Accordingly, even in a case where a plating solution is frequently changed near the opening of the hole, the plating layer is not directly deposited on the opening portion of the hole. Thus, the opening portion of the hole can be prevented from being buried with the plating layer in a state where a void is formed inside the hole.

In addition, according to the present invention, since the seed layer is formed on the bottom surface of the hole and a part of the side wall of the hole, the plating layer can be formed fast as compared with a case where the seed layer is formed only on the bottom surface of the hole. Thereby, the amount of time required to form the through electrode can be reduced.

Moreover, according to the present invention, a method of manufacturing the aforementioned semiconductor device can be provided.

Specifically, the present invention provides the method of manufacturing a semiconductor device including the steps of: forming a hole in at least one of an insulating layer and a semiconductor layer; forming a seed layer that covers, without covering a first region of a side wall from the opening of the hole to a predetermined position between the opening of the hole and the bottom surface of the hole, a second region of the side wall from the predetermined position to the bottom surface of the hole; and forming a plating layer that covers the seed layer and at least a part of the first region.

According to the present invention, a semiconductor device capable of suppressing the occurrence of a void in a through electrode and of reducing the amount of time required to form the through electrode, and a method of manufacturing the semiconductor device can be provided.

DETAILED DESCRIPTION OF THE PREFERRED EMBODIMENTS

Hereinafter, embodiments of the present invention will be described with reference to drawings.

First Embodiment

Figure 1:
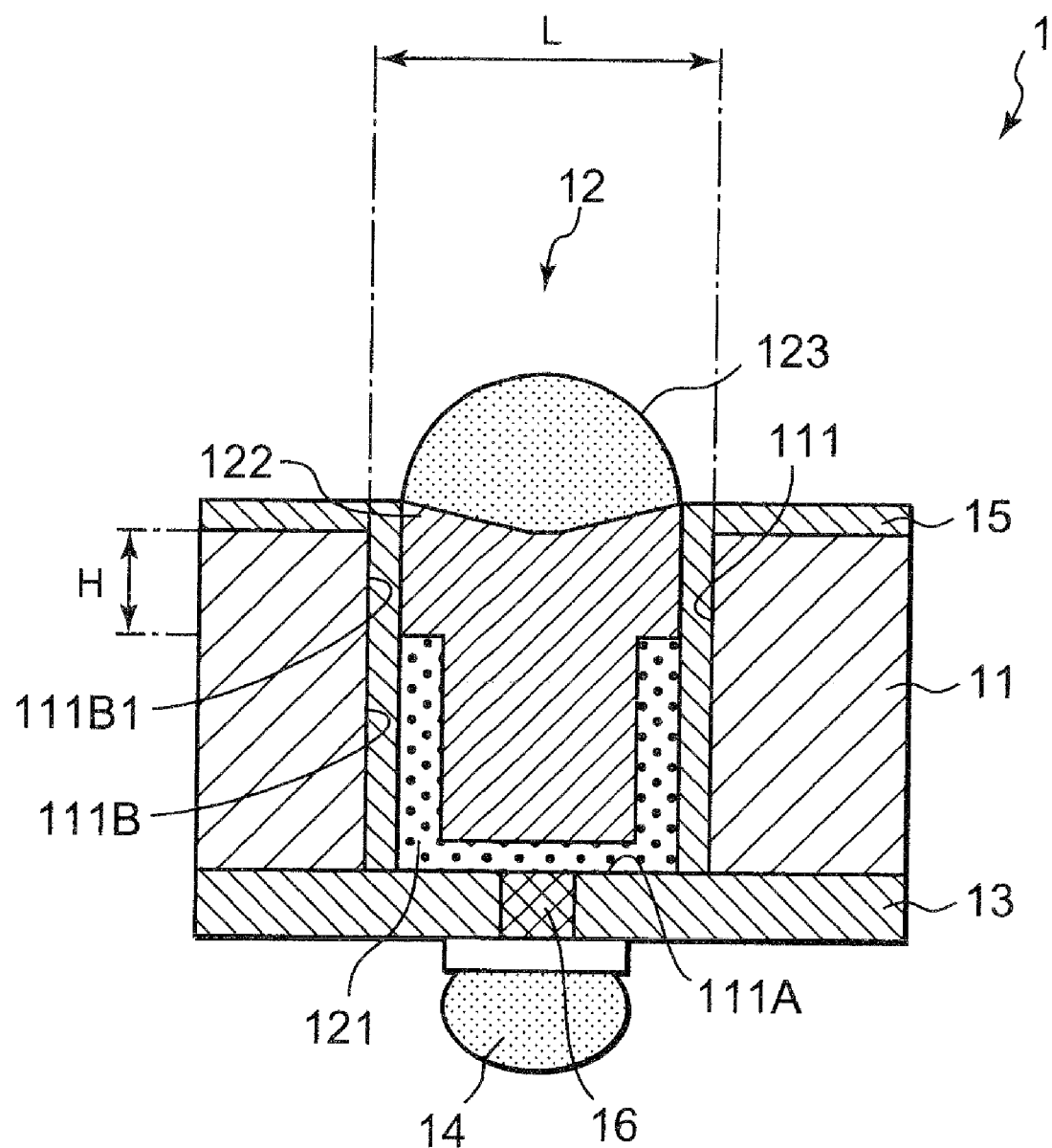
FIG. 1 is a cross sectional view of a semiconductor device according to a first embodiment of the present invention.

FIG. 1 shows a semiconductor device 1 according to the present embodiment.

First, outlines of the semiconductor device 1 according to the embodiment will be described. It should be noted that throughout the descriptions to be provided below, the same reference numerals are assigned to components that are identical to those having been described before, and descriptions thereof are omitted.

The semiconductor device 1 includes: a body 11, which is at least one of an insulating layer and a semiconductor layer each including a hole 111 formed therein; and a through electrode 12 provided in the hole 111 of the body 11.

The through electrode 12 includes a seed layer 121 and a plating layer 122.

The seed layer 121 covers a bottom surface 111A of the hole 111. On the other hand, the seed layer 121 does not cover a first region of a side wall 111B of the hole 111, the first region being a region from the opening of the hole 111 to a predetermined position between the opening of the hole 111 and the bottom surface 111A (hereinafter, the first region is referred to as an "uncoated region" denoted by reference numeral 111B1). However, the seed layer 121 does cover a second region that is a region excluding the uncoated region 111B1 of the side wall 111B of the hole 111. Specifically, the second region is a region from the predetermined position to the bottom surface 111A of the hole 111.

The plating layer 122 covers the seed layer 121 and at least a portion of the uncoated region 111B1, which specifically means at least a region from the predetermined position and a position between the predetermined position and the opening of the hole 111.

Next, a description will be given of the semiconductor device 1 in detail.

The semiconductor device 1 according to the present embodiment includes: a semiconductor substrate 11 serving as the body 11 being a semiconductor layer; the through electrode 12; an interconnect layer 13; and an electrode 14.

The semiconductor substrate 11 is a silicon substrate, for example. The hole 111 penetrating through the front and rear surfaces of the semiconductor substrate 11 is formed in the semiconductor substrate 11.

In this embodiment, the diameter of the hole 111 is substantially constant from the rear surface of the semiconductor substrate 11 to the front surface of the same. The shape of the hole 111 is a cylindrical shape, for example.

An insulating film 15 is provided in such a manner to cover the side wall of this hole 111 and the rear surface (which is the upper surface in FIG. 1) of the semiconductor substrate 11.

This insulating film 15 directly covers the side wall of the hole 111 of the semiconductor substrate 11 and the rear surface of the semiconductor substrate 11. The insulating film 15 can be a single-layered film made of any one of SiO2, SiN and SiON, or a multilayered structure of these, for example.

In this embodiment, although not illustrated, a barrier film that covers the insulating film 15 may be provided on the insulating film 15. In this case, a multilayered film is formed of the insulating film 15 and the barrier film.

The barrier film is provided for preventing metal diffusion, and is, for example, a single layer film made of any one of TiN, TaN, TiW, Ti, Ta and Cr, or a multilayered structure formed of these.

The interconnect layer 13 is provided on the front surface (the lower surface in FIG. 1) of the semiconductor substrate 11 in such a manner to cover the front surface of the semiconductor substrate 11. An electrode plug 16 is provided to the semiconductor substrate 11 in such a manner to penetrate through the interconnect layer 13. The interconnect layer 13 and the electrode plug 16 are thus exposed from the opening of the front surface side of the semiconductor substrate 11 of the hole 111. Specifically, the interconnect layer 13 and the electrode plug 16 constitute the bottom surface of the hole 111.

It is to be noted that as a material of the electrode plug 16, tungsten or the like can be used, for example.

The through electrode 12 includes the seed layer 121, the plating layer 122 and a bump 123.

The seed layer 121 is a conductor layer, which includes a Ti film directly provided on the insulating film 15 and on the bottom surface 111A of the hole 111, and a Cu film provided on the Ti film.

It should be noted that the seed layer 121 is not limited to a multilayered film including a Ti film and a Cu film. The seed layer 121 may be a multilayered film including an Al film, a Pd film and the like.

This seed layer 121 covers the bottom surface 111A of the hole 111 and a part of the side wall 111B of the hole 111.

To be more specific, the seed layer 121 integrally covers the bottom surface 111A of the hole 111 and a region of the side wall 111B from the bottom surface 111A to a predetermined position between the bottom surface 111A and the opening of the rear surface side of the semiconductor substrate 11 of the hall 111. Accordingly, the seed layer 121 is formed substantially in a letter U shape in a cross sectional view as shown in FIG. 1.

In other words, the seed layer 121 does not cover a region of the side wall 111B of the hole from the opening of the rear surface side of the semiconductor substrate 11 of the hole 111 to the predetermined position along the depth direction of the hole 111 (the region between the rear surface side of the semiconductor substrate 11 of the hole 11 and the predetermined position between the opening and the bottom surface 111A of the hole 111). This region not covered with the seed layer 121 is the uncoated region 111B1.

Here, in a case where the diameter of the opening of the hole 111 is denoted by L, a region having a length not less than L/10 towards the bottom surface 111A of the hole 111 from the opening is defined as the uncoated region 111B1, or more preferably, the region having a length not less than L/2 is defined as the uncoated region 111B1 (specifically, the length of the region denoted by reference numeral H in FIG. 1 is not less than L/10, and is preferably not less than L/2).

Moreover, the length of the uncoated region 111B1 (the length denoted by reference numeral H in FIG. 1) is preferably 50% to 80% of the length from the opening of the side wall 111B to the bottom surface 111A.

The plating layer 122 is a single layer of any one of, or a multilayered structure of, Cu, Ni and Au, and covers the entire surfaces of the seed layer 121 and the uncoated region 111B1.

This plating layer 122 is formed in a cylindrical shape to fill in the hole 111. Moreover, the plating layer 122 is provided in such a manner not to protrude from the opening of the hole 111. Here, the position of the surface of the plating layer 122 on the rear surface side of the semiconductor substrate 11 substantially matches the position of the opening of the hole 111. Furthermore, the center portion of the surface of the plating layer 122 on the rear surface side of the semiconductor substrate 11 is recessed towards the inside of the hole 111.

The bump 123 is a conductor material provided on the plating layer 122, and protrudes from the rear surface of the semiconductor substrate 11.

This bump 123 is a solder bump. Incidentally, in order to improve the solder wettability of the solder bump, an Au film may be provided between the plating layer 122 and the bump 123.

The electrode 14 is provided on the front surface side of the semiconductor substrate 11. Specifically, the electrode 14 is provided on the interconnect layer 13. The electrode 14 is in contact with the electrode plug 16, which penetrates through the interconnect layer 13.

This electrode 14 is formed using a solder bump, for example.

Next, a description will be given of a method of manufacturing the semiconductor device 1 according to the present embodiment.

First, a description will be given of outlines of the method of manufacturing the semiconductor device 1 according to the embodiment.

The method of manufacturing the semiconductor device 1 includes the steps of: forming the hole 111 in the semiconductor device 1; forming the seed layer 121 that covers the bottom surface 111A of the hole 111, and that also covers, excluding the first region 111B1 (uncoated region) of the side wall 111B of the hole 111 from the opening of the hole 111 to a predetermined position between the opening of the hole 111 and the bottom surface 111A of the hole 111, the second region (which is the region from the predetermined position to the bottom surface of the hole); and forming the plating layer 122 covering the seed layer 121 and at least a part of the uncoated region 111B1.

Hereinafter, the detailed description will be given of the method of manufacturing the semiconductor device 1 according to the present embodiment with reference to FIGS. 2A to 2C and 3A and 3B.

Figure 2A:
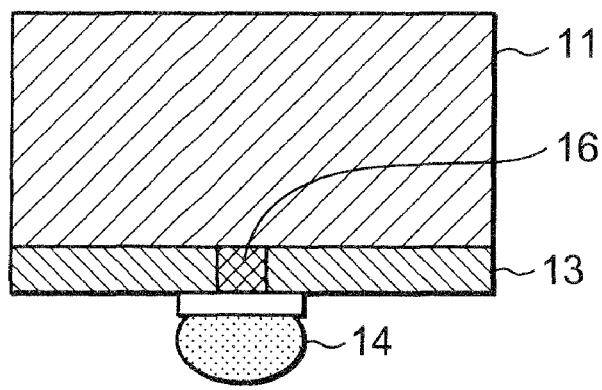
FIGS. 2A to 2C are diagrams showing steps of manufacturing the semiconductor device according to the first embodiment.

First, as shown in FIG. 2A, the rear surface of the semiconductor substrate 11 including the interconnect layer 13, the electrode plug 16 and the electrode 14 therein in advance is grinded and made thinner. At this time, a supporting member such as a silicon, a glass or a tape is preferably attached to the side of the interconnect layer.

Here, the semiconductor substrate 11 may be in the state of a wafer or of an individual chip.

Figure 2B:
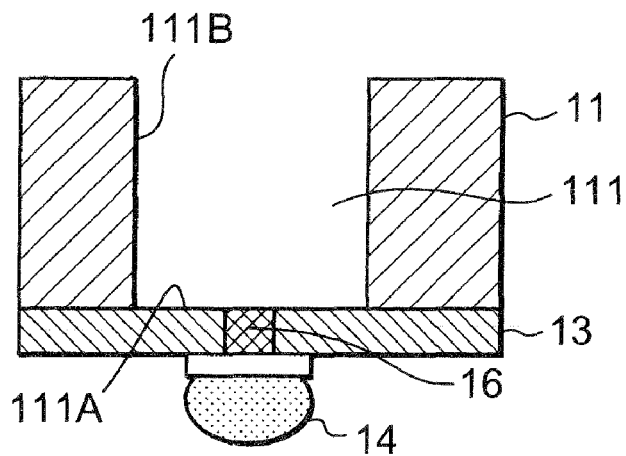

Next, as shown in FIG. 2B, the hole 111 is formed in the semiconductor substrate 11.

Specifically, an Si oxide film is formed on the rear surface of the semiconductor substrate 11. Then, by use of a photolithography technique, an opening is formed at a predetermined position of the Si oxide film. A part of the semiconductor substrate 11 is selectively removed by performing dry etching with the Si oxide film as the mask, the film including the opening formed therein. Thereby, the hole 111 is formed. As an etchant for dry etching, a gas such as fluorocarbon and SF6 can be used, for example. Thereafter, the Si oxide film is removed.

The shape of the hole 111 is a shape having a constant diameter from the front surface side of the semiconductor substrate 11 to the rear surface side thereof (a so-called, straight shape) in this embodiment. Such shape of the hole 111 can be formed by adjusting the etching conditions including a temperature, an etchant, an etching time and the like.

Next, the insulating film 15 that covers the rear surface of the semiconductor substrate 11 and inside the hole 111, is provided.

Figure 2C:
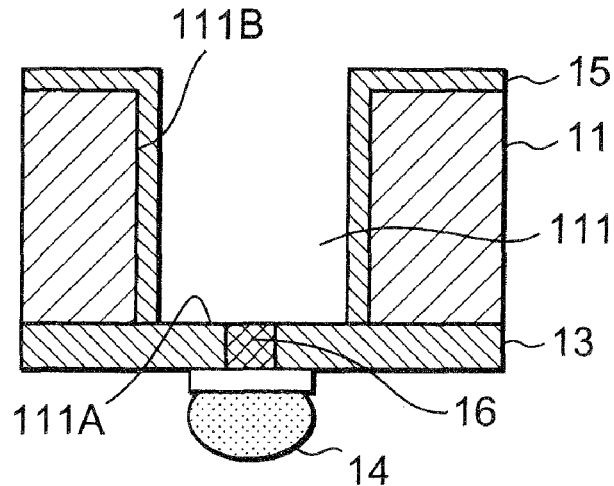

The insulating film 15 is formed by use of a chemical vapor deposition (CVD) method or the like so as to cover the rear surface of the semiconductor substrate 11, the side wall of the hole 111 and the bottom surface 111A of the hole 111. Thereafter, the insulating film 15 on the bottom surface 111A of the hole 111 is selectively removed by dry etching (FIG. 2C).

In a case where the insulating film 15 provided on the rear surface of the semiconductor substrate 11 is lost during the process of removing the insulating film 15 on the bottom surface of the hole 111, the insulating film 15 may be formed again by use of a photolithography technique, a CVD method or the like on a portion other than the hole 111.

Next, the seed layer 121 is formed inside the hole 111.

As a method of forming the seed layer 121, a sputtering method, a vapor deposition method or the like can be cited as an example.

Next, a photoresist is applied to the entire rear surface of the semiconductor substrate 11 and the entire surfaces of the bottom surface 111A of the hole 111 and the side wall 111B thereof. As the method of applying a photoresist, a spin coating method, a printing method or a laminating method can be cited as an example.

Thereafter, this photoresist is exposed. For example, a flood exposure (a method of radiating light from above the hole 111 in a perpendicular direction) or an oblique exposure (a method of radiating light from above the hole 111 in an oblique direction) can be used as the method of exposure.

At this time, it is difficult for the light to reach the bottom surface 111A of the hole 111 and a region of the side wall 111B of the hole 111 at the height of the predetermined position. For this reason, by the adjustments of the exposure conditions, such as the amount of exposure and exposure time, the portion of the photoresist covering the bottom surface 111A of the hole 111 and the region of the side wall 111B of the hole 111 at the height of the predetermined position remain unexposed. Accordingly, the photoresist selectively remains when development is performed.

Specifically, when development is performed, the photoresist covering the region from the opening of the hole 111 on the rear surface side of the semiconductor substrate 11 to the predetermined position along the depth direction of the hole 111, among the entire surface of the semiconductor substrate 11 and the sidewall 11B of the hole 111, is selectively removed.

Figure 3A:
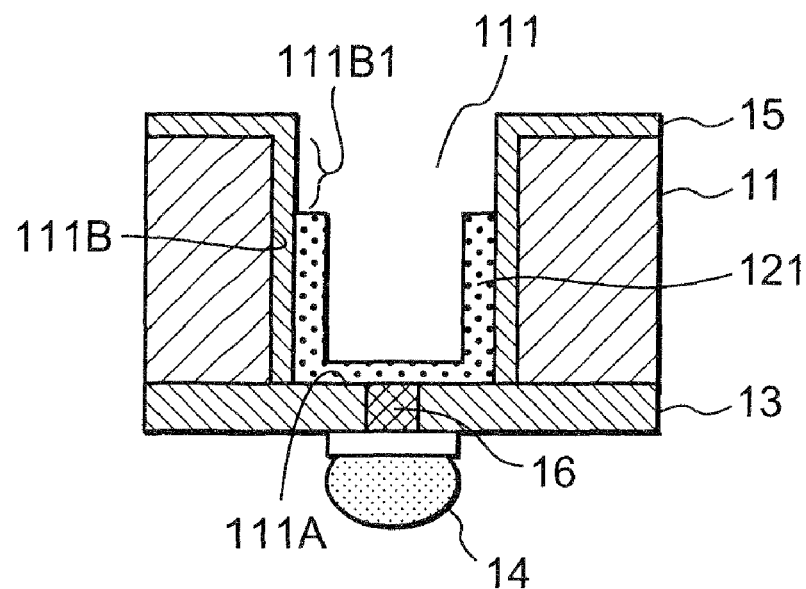
FIGS. 3A and 3B are diagrams showing steps of manufacturing the semiconductor device according to the first embodiment.

In the seed layer, the exposed portion of the seed layer is selectively removed by etching. Thereafter, the photoresist is removed. Thereby, the seed layer 121 as shown in FIG. 3A is obtained, and the uncoated region 111B1 is formed in the meantime.

Figure 3B:
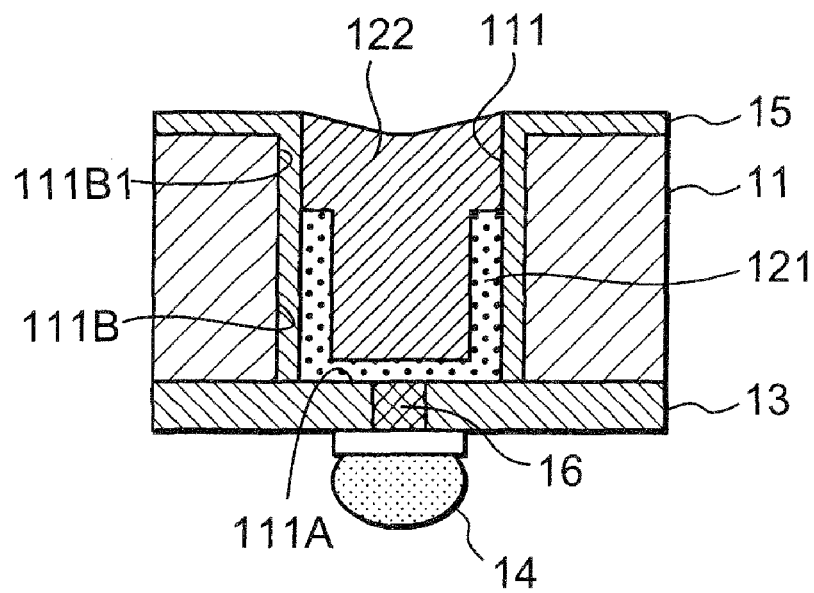

Next, the plating layer 122 is formed as shown in FIG. 3B.

The plating layer 122 is formed by an electroless plating method in such a manner that the inside of the hole 111 is filled with the plating layer 122.

It should be noted that in a case where the seed layer 121 is made of Cu, it is preferable that a Pd layer be previously formed only on Cu by a Pd catalyst treatment, and then, Cu or Ni be deposited by an electroless plating method.

Furthermore, in a case where the seed layer 121 is made of Al, it is preferable that a Zn layer be previously formed on Cu by a zincate treatment, and then, Ni be deposited by an electroless plating method.

Here, the uncoated region 111B1 is formed around the opening of the hole 111. Although the seed layer 121 is not provided in the uncoated region 111B1, the plating layer 122 is grown till the opening of the hole 111. At this time, the plating layer 122 does not grow directly from the uncoated region 111B1.

It should be noted that the plating layer 122 is formed in a manner not to protrude from the opening of the hole 111, which is made possible by the adjustments of the plating time, the plating temperature and the like of the plating layer 122.

Thereafter, the bump 123 is formed on the plating layer 122 by use of a solder dipping method, a solder paste printing method, a solder deposition method or the like.

Through the aforementioned processes, the semiconductor device 1 shown in FIG. 1 can be obtained.

Hereinafter, descriptions will be given of effects and advantages of the present embodiment.

In the embodiment, as shown in FIG. 1, the region in the side wall of the hole 111 from the opening on the rear surface side of the semiconductor substrate 11 to the predetermined position between the opening and the bottom surface 111A of the hole 111 is defined as the uncoated region 111B1 that is a region not covered with the seed layer 121.

Figure 9:
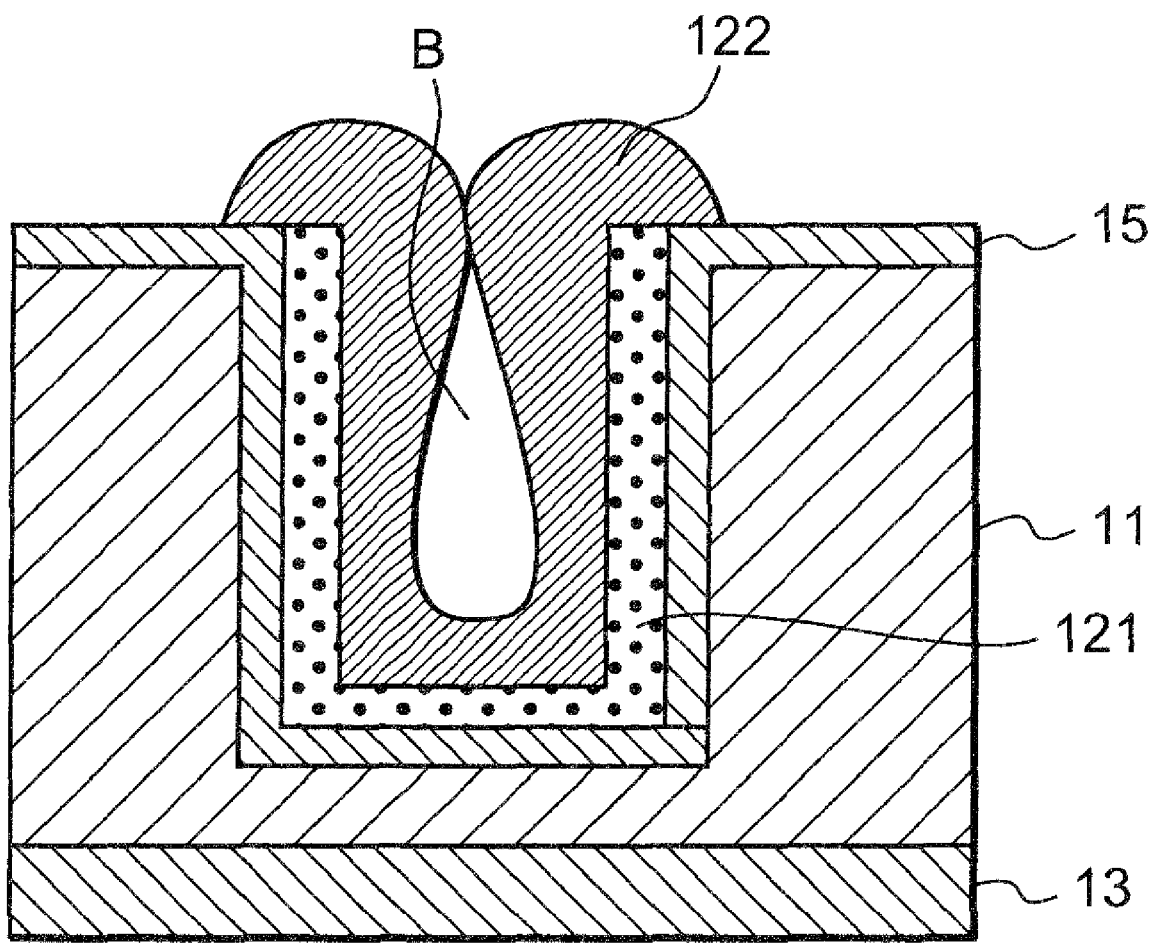
FIG. 9 is a cross sectional view of a semiconductor device, in which an uncoated region is not included.
Figure 10A:
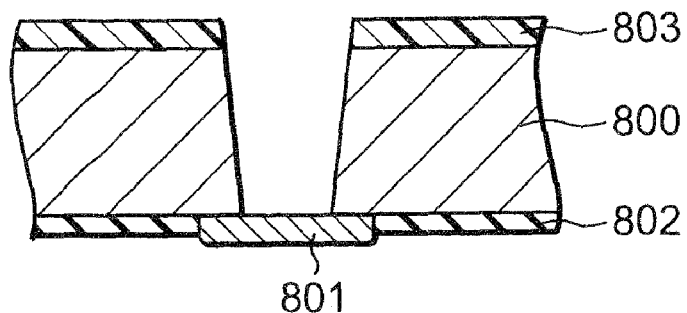
FIGS. 10A to 10D are diagrams showing steps of manufacturing a conventional semiconductor device.
Figure 10B:
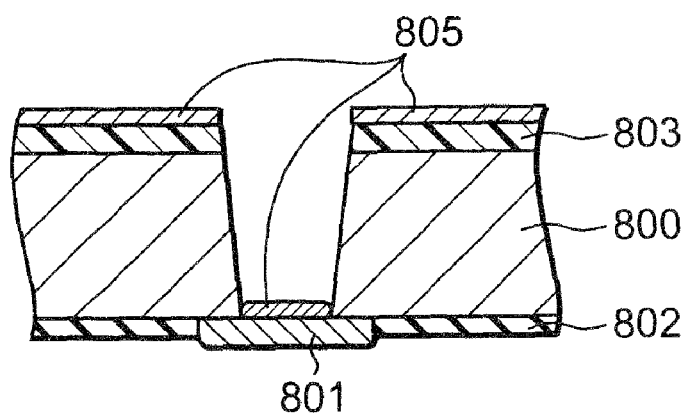
Figure 10C:
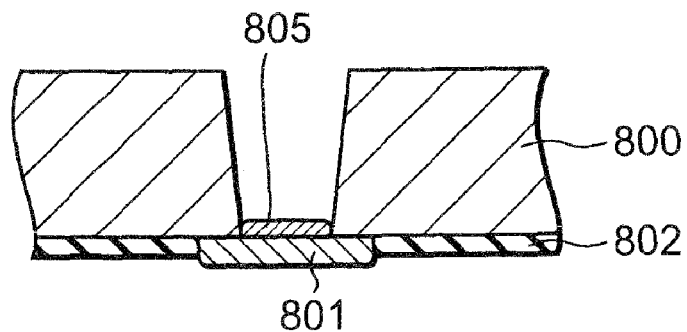
Figure 10D:
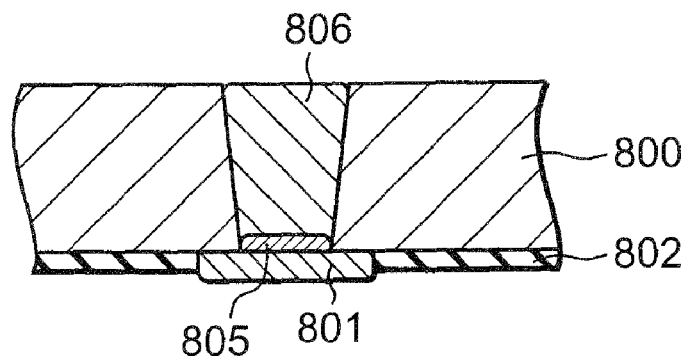
Figure 11A:
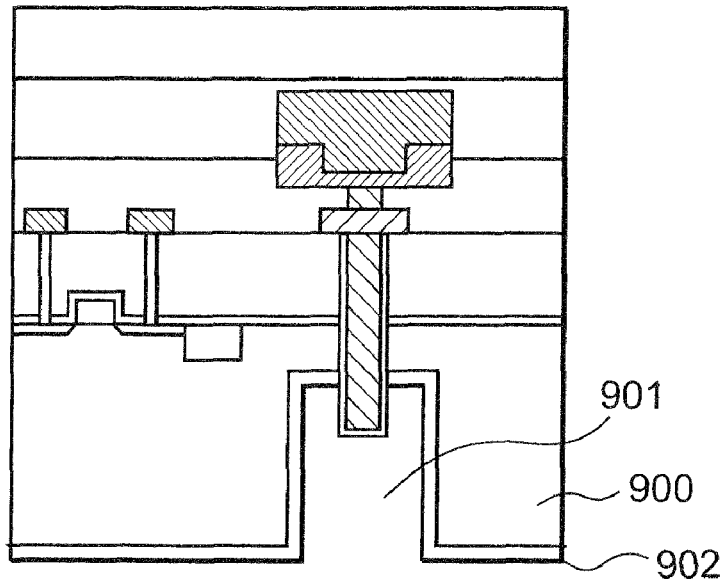
FIGS. 11A and 11B are diagrams showing steps of manufacturing a conventional semiconductor device.
Figure 11B:
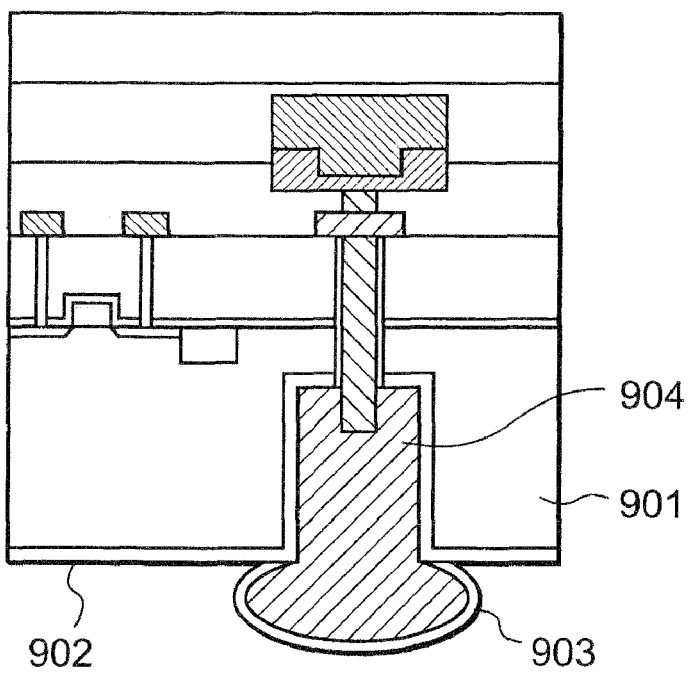

In a case where the entire surface of the side wall 111B is covered with the seed layer 121 without having the uncoated region 111B1, as shown in FIG. 9, the opening of the hole is filled with the plating layer 122, causing a large void B to be generated in the hole. This is because the growth rate of the plating around the opening of the hole becomes fast as compared with the growth rate of the plating inside the hole since plating solution is frequently changed around the opening of the hole.

In contrast to this case, in this embodiment, even in a case where plating solution is frequently changed around the opening of the hole 111, the plating layer 122 is not directly deposited on the opening of the hole 111 since the uncoated region 111B1 is provided. Thus, the region around the opening of the hole 111 can be prevented from being filled with the plating layer 122 in a state where the void is formed in the hole 111.

Moreover, the seed layer 121 is formed on the bottom surface 111A of the hole 111 and a part of the side wall 111B thereof in the present embodiment. Thus, the plating layer 122 can be formed fast in comparison with the case where the seed layer is formed only on the bottom surface 111A of the hole 111. Thereby, the amount of time required to form the through electrode 12 can be reduced.

In addition, in a case where the entire surface of the side wall of the hole is covered with the seed layer, a large portion of the plating layer protrudes from the hole as shown in FIG. 9. This is because the plating layer grows in an isotropic manner. For this reason, a process of flattening the surface by use of a chemical mechanical polishing (CMP) method or the like needs to be performed during a process before forming the bump.

In contrast to this, in the present embodiment, the uncoated region 111B1 not covered with the seed layer 121 is formed. Thus, the plating layer 122 can be prevented from protruding from the hole 111 since the growth of the plating layer 122 stops before the plating layer 122 protrudes from the hole 111 because of the presence of the uncoated region 111B1.

Thereby, the process of flattening the surface by a CMP method or the like is no longer required. Thus, it is possible to aim to reduce the costs associated with the manufacturing of the semiconductor device 1.

Moreover, in the present embodiment, in a case where the diameter of the opening of the hole 111 is denoted by L (refer to FIG. 1), a region having a length not less than L/10 from the opening of the hole 111 towards the bottom surface 111A of the hole 111 is defined as the uncoated region 111B1.

Thereby, the plating layer 122 can be easily prevented from protruding from the opening of the hole 111. Specifically, in a case where the length of the uncoated region 111B1 is less than L/10, the plating layer needs to be accurately formed in order to prevent the plating layer 122 from protruding from the hole 111. However, in a case where the length of the region is set at not less than L/10, the plating layer 122 can be grown under moderate conditions.

In addition, in a case where the length of the uncoated region 111B1 is set at less than L/10 while causing the plating layer 122 to be prevented from protruding from the opening of the hole 111, the thickness of the plating layer 122 to be formed on the seed layer 121 is reduced. For this reason, there is a concern that resistance against reduction in the portion of the plating layer 122 may not be sufficient, the reduction being caused by solder during the process of forming the bump 123.

In contrast to this, in this embodiment, the length of the uncoated region 111B1 is set at not less than L/10. Thus, it is possible to secure that a sufficient amount of the thickness of the plating layer 122 formed on the seed layer 121 is obtained. Accordingly, it is possible to obtain a sufficient amount of the resistance characteristic of the plating layer 122 against the reduction in the portion of the plating layer 122, the reduction being caused by solder during the process of forming the bump 123.

Furthermore, in the present embodiment, in a case where the diameter of the opening of the hole 111 is set at L, a region having a length not less than L/2 from the opening of the hole 111 towards the bottom surface 111A of the hole 11 can be defined as the uncoated region 111B1.

In this case, the hole 111 is filled with the plating layer 122 up to the center portion of the hole 111 at the time the plating layer 122 grows in an amount of length equivalent to L/2 from the side wall 111B towards the center of the hole. In addition, since the plating layer 122 grows in an isotropic manner, the plating layer 122 grows in an amount of length equivalent to L/2 also from the upper end of the seed layer 121 towards the opening of the hole 111. Accordingly, by setting a region having a length not less than L/2 from the opening along the depth direction of the hole 111 as the uncoated region 111B1, the amount of a void to be generated in the plating layer 122 can be suppressed at the minimum level, and also the shape of the plating layer 122 can be controlled not to protrude from the opening of the hole 111.

Second Embodiment

A description will be given of a second embodiment of the present invention with reference to FIGS. 4A and 4B.

In the aforementioned embodiment, the diameter of the hole 111 of the semiconductor device 1 from the rear surface side of the semiconductor substrate 11 to the front surface side thereof is substantially constant, and thus, the shape of the hole 111 is a so-called straight shape.

Figure 4A:
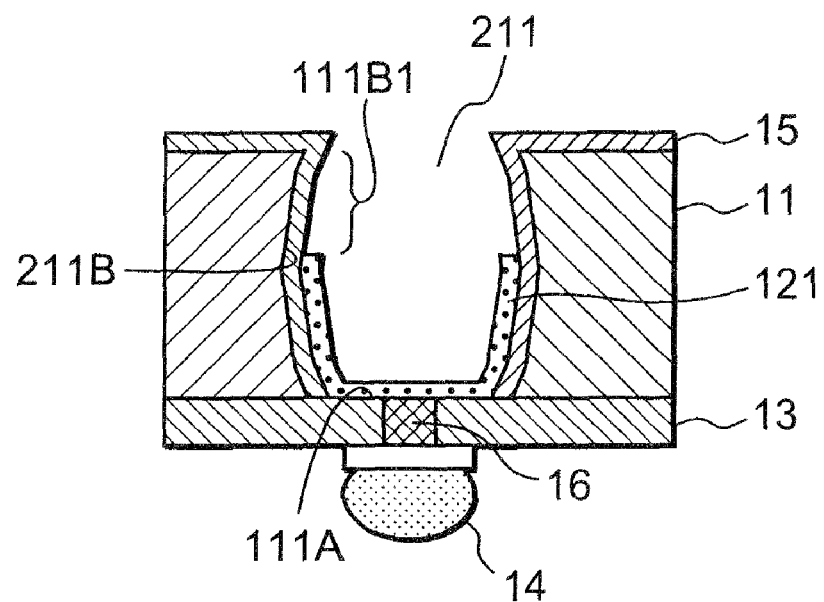
FIGS. 4A and 4B are diagrams showing steps of manufacturing a semiconductor device according to a second embodiment of the invention.
Figure 4B:
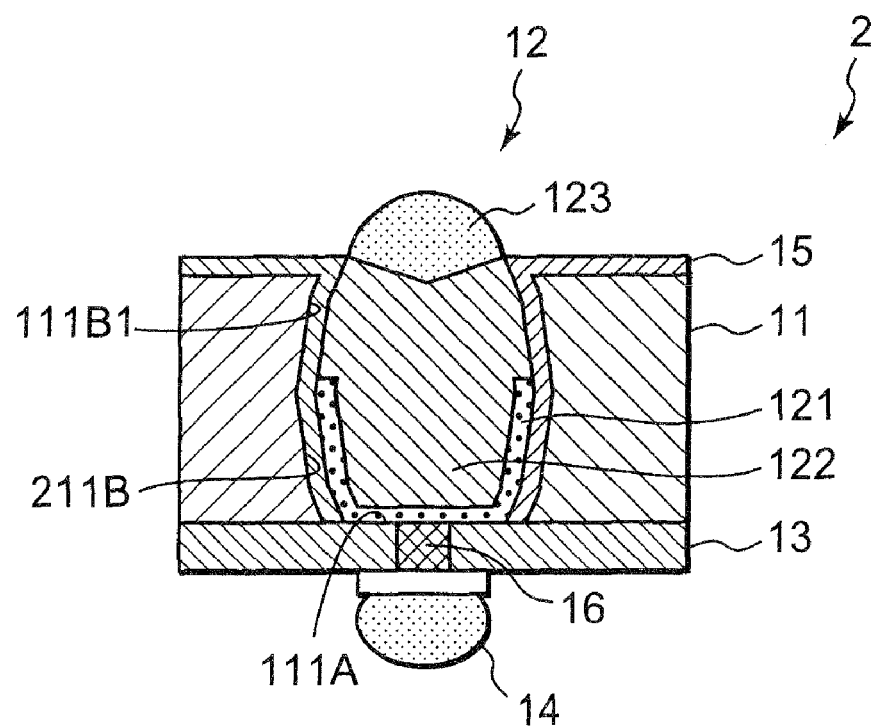

In contrast to this, in the present embodiment, a side wall 211B of a hole 211 protrudes towards the outside of the hole 211 as shown in FIGS. 4A and 4B. The shape of the hole 211 is a so-called bowing shape. The side wall 211B of the hole 211 protrudes towards the outside of the hole 211 in an arched shape.

The diameter of hole 211 is substantially largest at the center portion of the hole 111 in the depth direction. The diameters of the respective openings on the front surface side and the rear surface side of the semiconductor substrate 11 are substantially the same.

The configuration of a semiconductor device 2 of the present invention other than the part described above is the same as that of the semiconductor device 1.

As shown in FIGS. 4A and 4B, the semiconductor device 2 described above can be manufactured by use of a method similar to the method used for manufacturing the semiconductor device 1 according to the first embodiment.

Incidentally, FIG. 4A shows a process in which the seed layer 121 is formed, and FIG. 4B shows a state where the semiconductor device 2 is completed.

In order to form the hole 211 into a bowing shape, etching is performed in a manner that the etching proceeds in the thickness direction of the semiconductor substrate 11 and in the direction towards the surface inside the substrate by reducing the linearity of ions while improving diffusion characteristics thereof during the process of forming the hole 211 by dry etching. Specifically, when dry etching is performed, etching conditions may be appropriately adjusted by increasing temperature while reducing the degree of vacuum.

According to the present embodiment, the same effects as those of the first embodiment can be brought about. In addition, the following advantages can be achieved.

In this embodiment, since the hole 211 is of a bowing shape, the plating layer 122 can be prevented from falling off of the hole 211.

Specifically, the adhesiveness between the plating layer 122 and the uncoated region 111B1, which is not provided with the seed layer 121, is not good. Accordingly, when a tensile force is applied to the through electrode 12, or when a force is applied to the through electrode 12 due to deformation of the semiconductor substrate 11, the plating layer 122 easily falls off of the hole 211. However, in this embodiment, the plating layer 122 can be securely prevented from falling off of the hole 211 since the hole 211 is formed in a bowing shape having the diameter of the opening smaller than the diameter of the center portion in the depth direction.

Moreover, when the hole 211 is formed in a bowing shape, the etching conditions of the semiconductor substrate 11 can be moderate in comparison with the case where the hole 111 is formed in a straight shape as in the first embodiment. In order words, the forming of the hole 211 is easier when the hole 211 is formed in a bowing shape.

Third Embodiment

A description will be given of a third embodiment of the present invention with reference to FIG. 5.

In this embodiment, a plurality of grooves 311C each having a ring shape along the circumferential direction of a hole 311 are provided on a side wall 311B of the hole 311 of the semiconductor substrate 11.

In addition, although the seed layer 121 is provided on the side wall 111B of the hole 111 and the bottom surface 111A in a continuous manner in the first embodiment, and on the side wall 211B of the hole 211 and the bottom surface 111A in a continuous manner in the second embodiment, seed layers 321 in this embodiment are provided to the side wall 311B of the hole 311 in an intermittent manner. The other parts of the configuration in this embodiment are the same as those in the first embodiment.

A detailed description will be given below of a semiconductor device 3 according to the present embodiment.

Figure 5A:
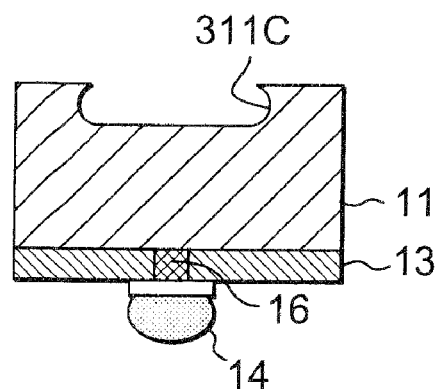
FIGS. 5A to 5D are diagrams showing steps of manufacturing a semiconductor device according to a third embodiment of the invention.
Figure 5B:
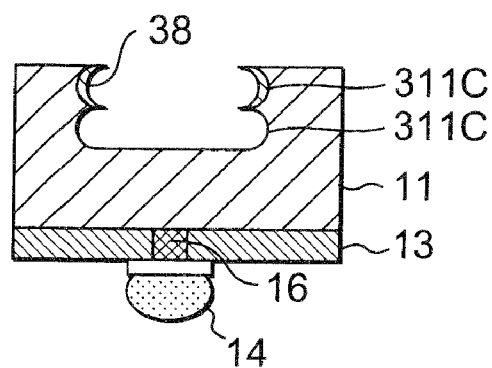
Figure 5C:
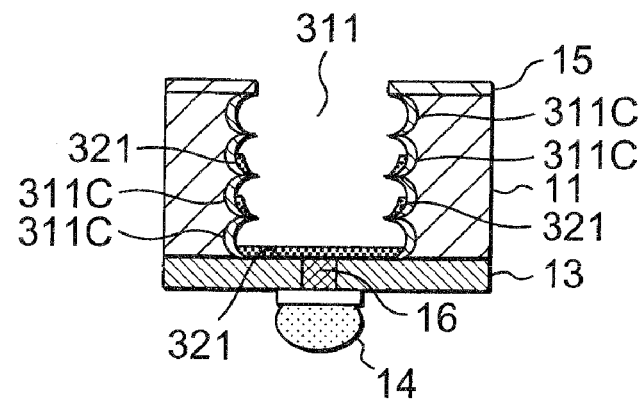
Figure 5D:
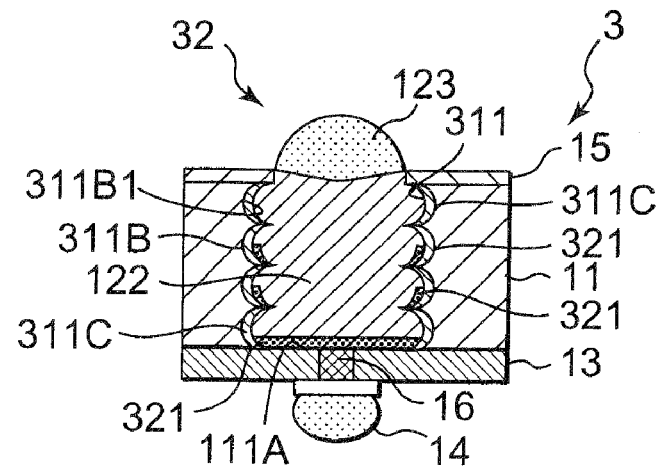

As shown in FIG. 5D, the hole 311 of the semiconductor substrate 11 is formed in a so-called scallop shape. The side wall of each of the grooves 311C is curved substantially in an arch shape. The plurality of grooves 311C, for example, four grooves 311C, are arranged without having any space between one another.

The insulating film 15 is provided in such a manner to cover the entire surfaces of the plurality of grooves 311C.

A through electrode 32 according to the present embodiment includes the bump 123 and the plating layer 122 similar to those of the aforementioned embodiments, and seed layers 321.

The seed layers 321 are provided in such a manner to cover the entire bottom surface of the hole 311 and portions of the side wall 311B.

Specifically, one of the seed layers 321 covers the entire bottom surface of the hole 311. The other seed layers 321 respectively cover only portions of the grooves 311A, each portion being on the bottom surface 111A side of the hole 311 (for example, a region of a surface constituting each of the grooves 311C, which region has a length not greater than ⅔ of the surface from the bottom surface side 111A of the hole 311). The seed layers 321 are provided to the side wall 311B of the hole 311 in an intermittent manner.

In addition, the seed layers 321 are not provided on all of the grooves 311C. The seed layers 321 are provided on some of the plurality of grooves 311C near the center portion of the hole 311 between the opening of the hole 311 and the bottom surface 11A of the hole 311. In this embodiment, the seed layers 321 cover portions of the second and third grooves 311C of the hole 311 from the rear surface side of the semiconductor substrate 11, each of the portions being a region of the groove 311C on the bottom surface side of the hole 311.

In other words, in this embodiment, on the side wall 311B of the hole 311, the regions from the opening on the rear surface side of the semiconductor substrate 11 to a predetermined position between the opening and the bottom surface 111A of the hole 311 (the surface of the first groove 311C and a portion on the opening side of the second groove 311C) are the uncoated regions 311B1, each of which is the portion not covered with the seed layer 321. In addition, the portion on the opening side of the third groove 311C, and substantially, the entire surface of the fourth groove 311C are uncoated regions not covered with the seed layers 321. Accordingly, a plurality of uncoated regions are provided in different positions in this embodiment.

It should be noted that the seed layers 321 are made of the same material as that of the seed layer 121 in the aforementioned embodiments.

Next, a description will be given of a method of manufacturing the semiconductor device 3 according to the present embodiment with reference to FIGS. 5A to 5D.

First, the hole 311 is formed in the semiconductor substrate 11. This hole 311 can be formed by so-called Bosch process.

Specifically, a mask including an opening formed therein is provided on the semiconductor substrate 11 including the interconnect layer 13, the electrode plug 16 and the electrode 14. Then, the first groove 311C is formed by dry etching (FIG. 5A).

Next, as shown in FIG. 5B, a protection film 38 is formed in such a manner to cover the first groove 311C. The protection film 38 is made of fluoride, and is formed by supplying a fluorine-containing halogen gas or the like.

Next, the second groove 311C is formed by performing a dry-etching process again. Thereafter, a protection film 38 (not shown) is formed in such a manner to cover the second groove 311C. The plurality of grooves 311C are obtained by repeating the aforementioned operation.

Next, the protection films 38 are removed by cleansing, and the surfaces of the grooves 311C are exposed.

Thereafter, the insulating film 15 is provided in the same manner as that of the aforementioned embodiment.

Next, the seed layers 321 are formed by a sputtering method. In a case where a sputtering method is used, the films are not formed on portions inside the hole 311 which portions are shaded when viewed from the opening of the rear surface side of the semiconductor substrate 11 of the hole 311.

Accordingly, the seed layers 321 are formed on the bottom surface of the hole 311 and only on the portions of the grooves 311C that can be observed when viewed from the opening side of the hole 311 as shown in FIG. 5C.

Thereafter, the plating layer 122 and the bump 123 are provided by use of the same method as those used in the aforementioned embodiments.

Through the aforementioned processes, a semiconductor device 3 as shown in FIG. 5D can be obtained. It should be noted that although, in the case of the present embodiment, the seed layers 321 are formed without using a photoresist on the bottom surface of the hole 311 and only on the portions of the grooves 311C that can be observed when viewed from the opening side of the hole 311, the method of forming the seed layers 321 is not limited to such a method. The seed layers 321 may be formed in a similar manner to those in the first and second embodiments. Specifically, a seed layer 321 is formed on the entire side wall of the hole 311, and thereafter, a photoresist is applied thereto. Next, the surface is irradiated with light so that the photoresist is selectively left up to a predetermined position of the side wall of the hole from the bottom surface of the hole 311. Then, by etching the seed layers of uncoated regions with the photoresist as the mask, the seed layers 321 are formed.

In the method used in the present embodiment, however, the seed layers 321 can be easily formed by forming the seed layers 321 on the bottom surface of the hole 311 and only on the portions of the grooves 311C that can be observed from the opening side of the hole 311.

According to the present embodiment, the same effects as those of each of the first and second embodiments can be brought about. In addition, the following advantages can be achieved.

In this embodiment, since the hole 311 is formed in a scallop shape, the plating layer 122 can be prevented from falling off of the hole 311. In particular, in this embodiment, the adhesiveness of the plating layer 122 to the hole 311 is reduced since the seed layers 321 are provided in a discontinuous manner. In the meantime, the plating layer 122 can be effectively prevented from falling off of the hole 311 since the hole 311 is formed in a scallop shape.

In addition, in the present embodiment, the seed layers 321 are intermittently provided for the side wall 311B in such a manner to cover only the portions of some of the grooves 311C, each of the portions being on the bottom surface side of the hole 311.

By providing the seed layers 321 in the intermittent manner, stress occurring inside of the seed layers 321 can be reduced as compared with the case where the seeds layers are integrally formed. In a case where a large amount of internal stress occurs in a seed layer, a clack may occur in the semiconductor substrate 11. In this embodiment, however, internal stress occurring inside the seed layers 321 can be reduced. Thus, the occurrence of a clack in the semiconductor substrate 11 can be surely suppressed.

Moreover, in a case where the hole 311 is formed in a scallop shape, and also the seed layers are integrally formed on the side wall 311B of the hole 311, there is a possibility that a void occurs in the plating layer. Since the plating layer grows while retaining the shape of the seed layer, it is conceivable that a void may occur in the plating layer in the case where the seed layers are integrally formed on the side wall 311B of the hole 311.

In contrast to this, as in the case of the present embodiment, by forming the hole 311 in a scallop shape and then providing the seed layers intermittently for the side wall 311B of the hole 311, the occurrence of a void in the plating layer 122 can be suppressed.

Fourth Embodiment

A description will be given of a fourth embodiment of the present invention with reference to FIGS. 6A and 6B.

In the first to third embodiments, the position of the surface of the plating layer 122 is substantially at the same position as those of the openings of the holes 111, 211 and 311. In contrast to this, in a semiconductor device 4 according to the present embodiment, the surface of a plating layer 422 is positioned at an inner side of the hole 111 from the opening of the hole 111 as shown in FIG. 6B.

The plating layer 422 covers, without covering the entire surface of the uncoated region 111B, a portion of the uncoated region 111B1 from the top of the seed layer 121 to the position in the middle of the region between the top of the seed layer 121 and the opening on the rear surface side of the hole 111.

It should be noted that the plating layer 422 is made of the same material as that of the plating layer 122.

The other parts of the configuration in this embodiment are the same as those in the first embodiment.

Figure 6A:
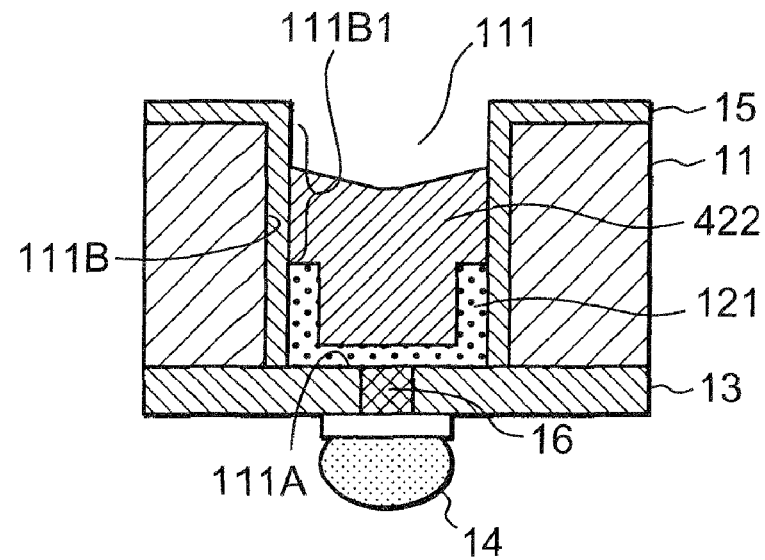
FIGS. 6A and 6B are diagrams showing steps of manufacturing a semiconductor device according to a fourth embodiment of the invention.
Figure 6B:
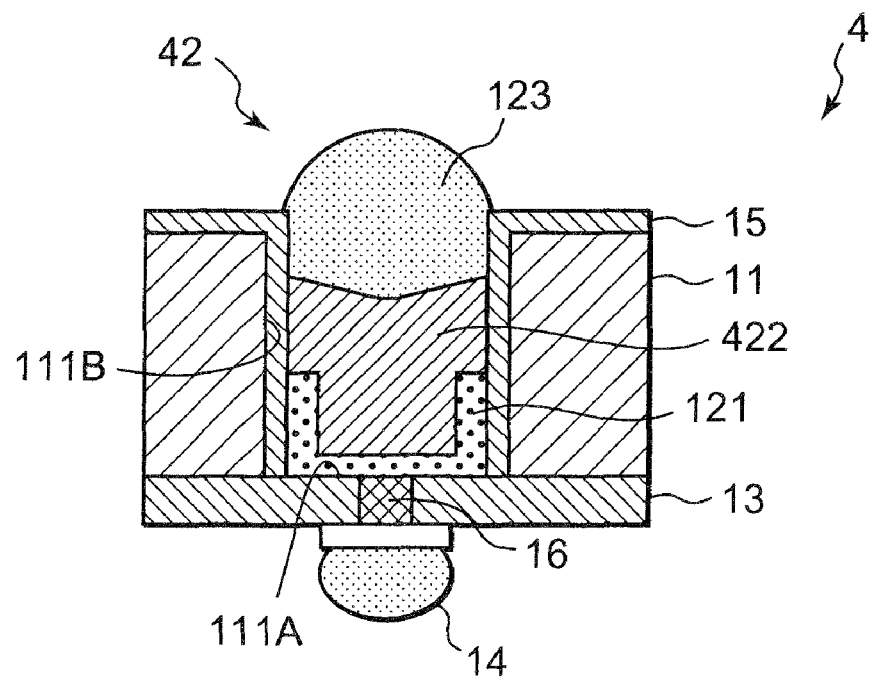

In the case of the present embodiment, as shown in FIG. 6A, the growth of the plating layer 422 inside of the hole 111 may be stopped during the process of forming of the plating layer 422.

According to the present embodiment, the same effects as those of the first embodiment can be brought about. In addition, the following advantages can be achieved.

The height of a through electrode 42 can be easily aligned with the bump 123 even in a case where the growth of the plating layer varies.

Fifth Embodiment

A description will be given of a fifth embodiment of the present invention with reference to FIGS. 7A to 7C.

In the first to fourth embodiments, each of the plating layers 122 and 422 is provided in a cylindrical shape in such a manner that the holes 111, 211 and 311 are filled with the plating layers 122 and 422, respectively.

Figure 7A:
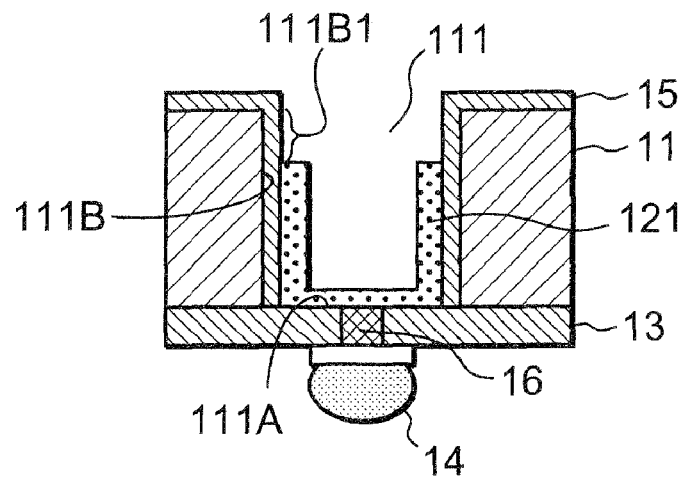
FIGS. 7A and 7C are diagrams showing steps of manufacturing a semiconductor device according to a fifth embodiment of the invention.
Figure 7B:
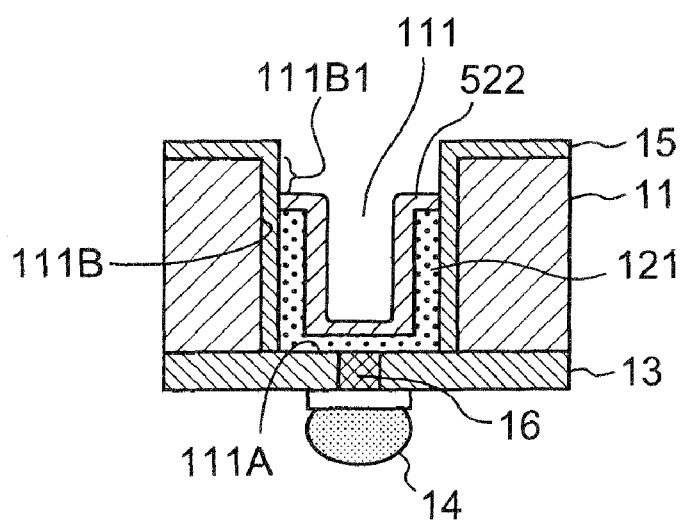
Figure 7C:
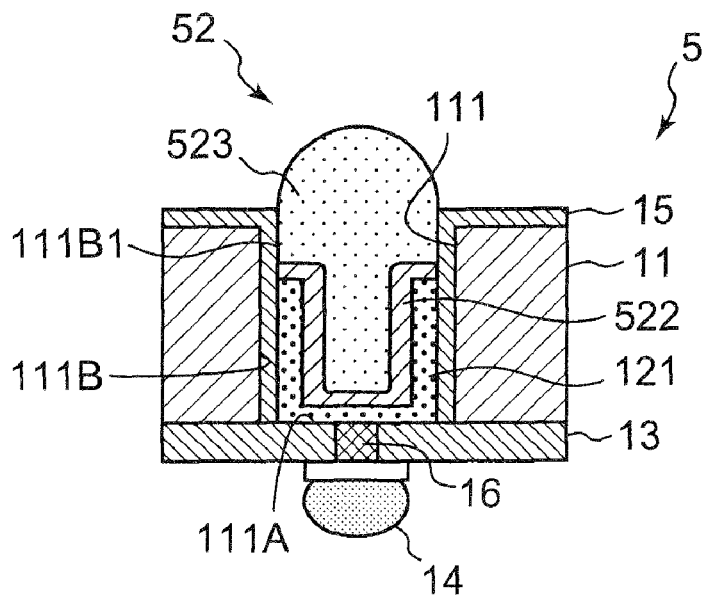

In contrast to this, in this embodiment, a plating layer 522 is formed in a film shape as shown in FIGS. 7B and 7C.

A through electrode 52 according to the present embodiment includes the seed layer 121, the plating layer 522 and a solder 523. A semiconductor device 5 according to the present embodiment is the same as the semiconductor device 1 according to the first embodiment except that the structure of the through electrodes 52 is different from that of the through electrode 12.

The plating layer 522 covers the seed layer 121 and also covers a portion of the uncoated region 111B1 from the top of the seed layer 121 to the position in the middle of the region between the top of the seed layer 121 and the opening on the rear surface side of the hole 111. The space formed by the inner surface of the plating layer 522 is filled with the solder 523, which is a conductive material.

This solder 523 includes a columnar shaped portion disposed in the space formed by the inner surface of the plating layer 522, and a protruding portion provided on this columnar shaped portion and protruding from the opening of the hole 111.

By reducing the processing time to form the plating layer 522, the semiconductor device 5 in the case of this embodiment can be manufactured by the same method as the one used in the case of the first embodiment.

Specifically, after the seed layer 121 is formed as shown in FIG. 7A, the plating layer 522 of a film shape is formed on the seed layer 121 as shown in FIG. 7B.

Thereafter, as shown in FIG. 7C, the solder 523 is provided so as to fill the space formed by the inner surface of the plating layer 522. The solder 523 can be provided by use of a solder dipping method, a solder deposition method or the like.

According to the present embodiment, the same effects as those of the first embodiment can be brought about. In addition, the following advantages can be achieved.

In the present embodiment, the growth of the plating layer 522 does not require any time since the plating layer 522 of a film shape is provided.

Sixth Embodiment

Figure 8:
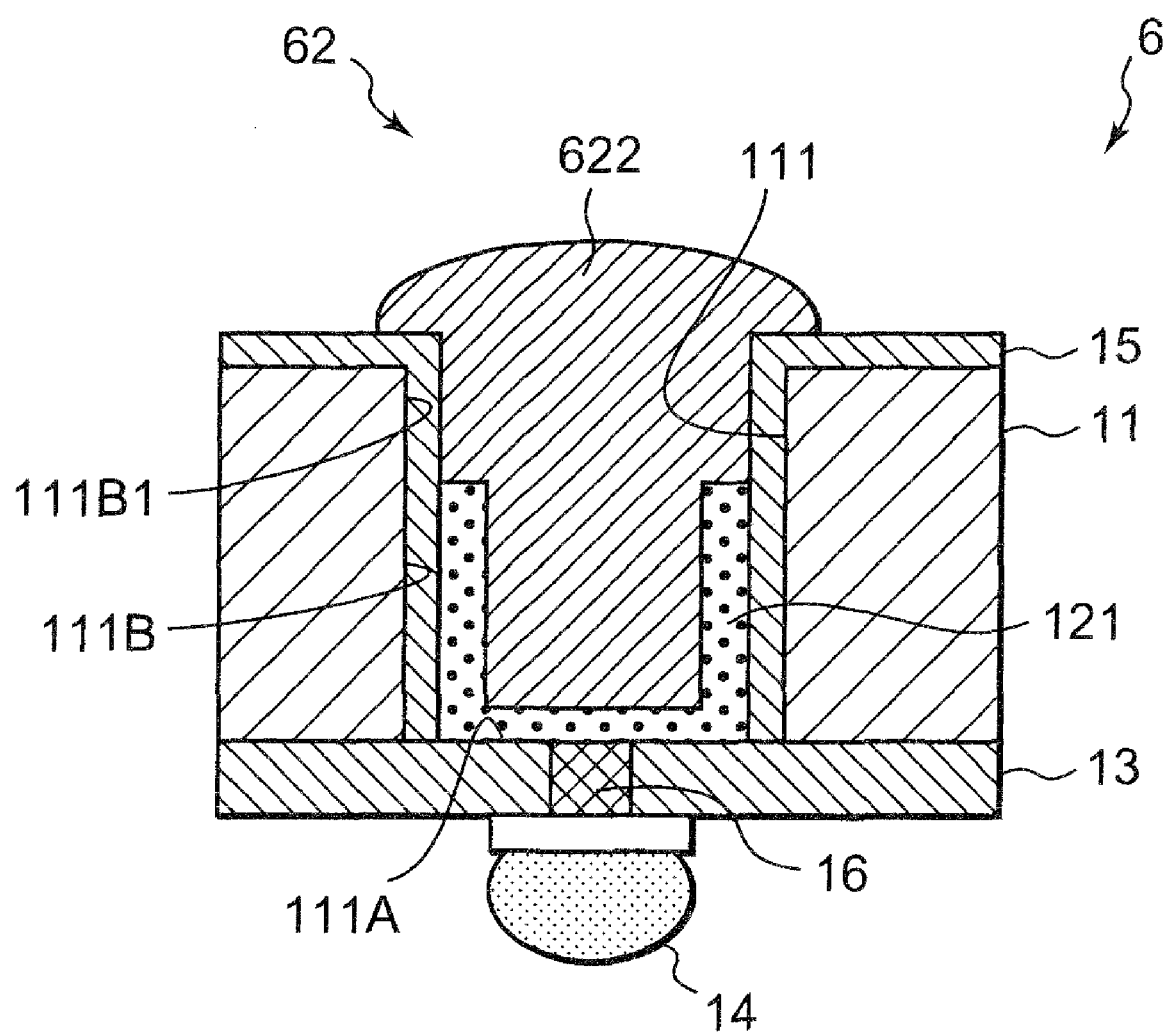
FIG. 8 is a cross sectional view of a semiconductor device according to a sixth embodiment of the present invention.

A description will be given of a sixth embodiment of the present invention with reference to FIG. 8.

In the first to fifth embodiments, the plating layers 122, 422 and 522 do not protrude from the holes 111, 211 and 311, respectively. In contrast to this, a plating layer 622 according to this embodiment protrudes from the opening of the hole 111.

A through electrode 62 according to the embodiment includes the seed layer 121 and the plating layer 622. The other parts of the configuration in this embodiment are the same as those in the first embodiment.

The plating layer 622 covers the seed layer 121 and the uncoated region 111B1, and includes a columnar shaped portion that fills inside the hole 111, and a protruding portion provided on this columnar shaped portion and protruding from the opening of the hole 111.

An Au layer, a solder layer or the like may be provided on the protruding portion.

By increasing the processing time for the growth of the plating layer 622, the semiconductor device 6 according to the present embodiment can be manufactured by use of substantially the same method as the one used in the case of the first embodiment.

It should be noted that the portion of the insulating film on the rear surface of the semiconductor substrate 11 is preferably formed with a film thickness not less than several hundreds to several thousands Å. In the meanwhile, the portion of the film thickness of the insulating film covering the side wall of the hole 111 may be approximately a film thickness of a natural oxide film.

According to the present embodiment, the same effects as those of the first embodiment can be brought about. In addition, the following advantages can be achieved.

In the embodiment, there is provided the plating layer 622 including a columnar shaped portion that fills inside the hole 111, and a protruding portion provided on the columnar shaped portion and protruding from the opening of the hole 111. Thus, it is not required to provide a solder bump when the through electrode 62 is formed. Thereby, the manufacturing process required for forming the through electrode 62 can be reduced.

It should be noted that the present invention is not limited to the aforementioned embodiments, and includes any changes or modifications within a range in which an object of the present invention can be achieved.

For example, in a case where the diameter of the opening of each of the holes 111, 211 and 311 is denoted by L, the uncoated region 111B1 is defined as a region having a length along the depth direction of the hole from the opening side to the position not less than L/10 in each of the aforementioned embodiments. The present invention is not limited to this, however.

Moreover, in each of the aforementioned embodiments, the seed layer 121 or the seed layers 321 are directly formed on the insulating layer 15. The present invention is not limited to this, however. A barrier film may be provided on the insulating layer. Then, the seed layer 121 or the seed layers 321 may be directly formed on the barrier layer.

Furthermore, in the second embodiment, after forming the seed layer 121 in such a manner to cover the bottom surface 111A of the hole 211 and the entire surface of the side wall 211B thereof, a photoresist is provided on the seed layer. Then, a part of the seed layer is removed by etching. The method of forming the seed layer 121 is not limited to this, however. For example, in a case where the side wall 211B of the hole 211 is curved to a large extent, the seed layer 121 is formed only on the portion on the bottom surface 111A side among the bottom surface 111A of the hole 211 and the side wall 211B of the hole 211 when the seed layer 121 is formed by a sputtering method. Accordingly, it is no longer necessary to provide a photoresist in a case where the seed layer 121 is formed in this manner, and thus, the seed layer 121 can be easily formed.

In addition, in the aforementioned embodiments, the holes 111, 211 and 311 are formed in a so-called straight shape, bowing shape and scallop shape, respectively. The present invention is not limited to this, however. For example, it is possible to employ a forward tapered shape in which the diameter of a hole gradually becomes small in the direction towards the bottom surface side of the hole from the opening side thereof or a reverse tapered shape in which the diameter of a hole gradually becomes small in the direction towards the opening side of the hole from the bottom surface side thereof.

When the hole is formed in a forward taper shape, it becomes easier to form a seed layer on the sidewall of the hole. Moreover, in a case where a plurality of holes are to be provided on a semiconductor substrate, it is possible to form the plurality of holes when the arrangement pitches of the holes are narrow.

On the other hand, when a reverse taper shape is employed, the plating layer can be surely prevented from falling off of the hole.

In addition, in the cases of the first and second embodiments and the fourth to sixth embodiments, the seed layer 121 formed in an integral manner is provided for the side walls 111B and 211B of the holes 111 and 211, respectively. The present invention is not limited to this, however. Seed layers may be provided for the side walls 111B and 211B of the holes 111 and 211 in an intermittent manner.

Moreover, in the aforementioned embodiments, the seed layers 121 and 321 are provided in such a manner to cover the entire surfaces of the bottom surfaces 111A of the holes 111, 211 and 311. The present invention is not limited to this, however. The bottom surface 111A may include a portion not covered with a seed layer.

It should be noted that the growth rate of a plating layer is faster when a seed layer is formed in such a manner to entirely cover the bottom surface of a hole, and also the plating layer can be surely prevented from falling off of the hole.

Furthermore, in the aforementioned embodiments, the through electrodes 12, 32, 42, 52 and 62 are configured to penetrate through the semiconductor substrate 11. The present invention is not limited to this, however. For example, each of the through electrodes may be configured to penetrate through an insulating layer formed on the semiconductor substrate.

In addition, although the interconnect layer 13 is formed on the front surface of the semiconductor substrate 11 of each of the semiconductor devices 1 to 6 in the aforementioned embodiments, it is not required to include an interconnect layer in each of the semiconductor devices. For example, the semiconductor device according to the present invention may be a silicon spacer, which is provided between semiconductor chips, and which electrically connects the semiconductor chips.

Moreover, a printed circuit board can may be used as a body 11.

What is claimed is:

1. A semiconductor device, comprising:
    at least one of an insulating layer and a semiconductor layer each including a hole formed therein; and
    a through electrode provided in the hole,
    wherein a side wall of the hole is constituted of a first region from the opening of the hole to a predetermined position between the opening of the hole and the bottom surface of the hole, and a second region which extends from the predetermined position to the bottom surface of the hole, and
    wherein the through electrode includes:
        a seed layer that covers a whole surface of the second region and the bottom surface of the hole without covering the first region; and
        a plating layer which covers the seed layer and at least a part of the first region,
        wherein the seed layer comprises a first portion and second portion, the first portion covering the bottom surface of the hole, the second portion covering the whole surface of the second region so as to extend along the side wall of the hole, and
    wherein the predetermined position is placed on a level that is higher than a surface of the first portion of the seed layer.

2. The semiconductor device according to claim 1, wherein the side wall of the hole protrudes towards the outside of the hole.

3. The semiconductor device according to claim 1, wherein the side wall of the hole includes a plurality of grooves formed therein, each of the plurality of grooves having a ring shape along the circumferential direction of the hole.

4. The semiconductor device according to claim 3, wherein the seed layer is separated into multiple parts and then intermittently provided for the side wall of the hole.

5. The semiconductor device according to claim 4, wherein at least one of the plurality of grooves includes the seed layer formed on a portion of the groove, the portion of the groove being on the bottom surface side of the hole.

6. The semiconductor device according to claim 1, wherein the diameter of the opening of the hole is denoted by L, and
    wherein the first region is defined as a region having a length not less than L/10 from the opening of the hole to a position towards the bottom surface of the hole.

7. The semiconductor device according to claim 1, wherein the diameter of the opening of the hole is denoted by L, and
    wherein the first region is defined as a region having a length not less than L/2 from the opening of the hole to a position towards the bottom surface of the hole.

8. The semiconductor device according to claim 1, wherein the plating layer fills the hole while not protruding from the opening of the hole, and the plating layer includes a conductive material provided thereon.

9. The semiconductor device according to claim 1, wherein the plating layer fills the hole while protruding from the opening of the hole.

10. The semiconductor device according to claim 1, wherein the side wall of the hole is covered with one of an insulating film and a multilayered film formed of an insulating film and a barrier film which prevents metal diffusion, and
    the seed layer is formed on one of the insulating film and the multilayered film.

11. The semiconductor according to claim 1, wherein at least one of the insulating layer and the semiconductor layer each including the hole therein is a semiconductor substrate.

12. An apparatus, comprising:
    a body;
    a hole selectively formed in the body, the body thereby including a first surface defining a side wall of the hole; and
    a conductor formed in the hole, the conductor including a seed layer and a plating layer, the seed layer being formed on a part of the first surface and extending along the sidewall of the hole from a bottom end of the sidewall of the hole up to a level that is lower than a tip end of the side wall of the hole,
    wherein the plating layer is formed to approximately fill the hole in contact with a portion of the first surface from the seed layer.

13. The apparatus as claimed in claim 12, wherein the body further includes a second surface defining a bottom of the hole and the seed layer is further formed to cover the second surface.

14. The semiconductor device according to claim 1, wherein the predetermined position is placed on a position between a surface of the first portion of the seed layer and the opening of the hole.

\* \* \* \* \*